United States Patent [19]

Bell, Jr. et al.

[11] Patent Number: 4,885,547

[45] Date of Patent: Dec. 5, 1989

[54] GAIN CELL WITH DIGITAL CONTROL

[75] Inventors: Marshall J. Bell, Jr., Camas, Wash.; Daniel S. Draper, Beaverton, Oreg.

[73] Assignee: Tektronix, Inc., Beaverton, Oreg.

[21] Appl. No.: 215,964

[22] Filed: Jul. 7, 1988

[51] Int. Cl.[4] .............................................. H03G 3/30
[52] U.S. Cl. ................................... 330/254; 330/279
[58] Field of Search ................ 330/129, 254, 279, 285

[56] References Cited

U.S. PATENT DOCUMENTS 4,156,283  5/1979  Gilbert ................................. 364/841

FOREIGN PATENT DOCUMENTS 41012  3/1980  Japan ..................................... 330/254
41013  3/1980  Japan ..................................... 330/254
6513   1/1981  Japan ..................................... 330/254

Primary Examiner—James B. Mullins
Attorney, Agent, or Firm—Edward B. Anderson; Peter J. Meza

[57] ABSTRACT

A differential amplifier in the form of a Gilbert gain cell is controlled by a pair of input currents applied to a pair of differentially coupled transistor pairs. A digital signal is generated and input into a CMOS digital-to-analog converter (DAC). The DAC outputs a pair of currents on conductors which are maintained at virtual ground by the use of a current mirror and an operational amplifier. The control signals applied to the differentially coupled transistor pairs are generated as base currents of transistors conducting the DAC output currents.

14 Claims, 2 Drawing Sheets

GAIN CELL WITH DIGITAL CONTROL

FIELD OF THE INVENTION

This invention relates to differential amplifiers, and more particularly, it relates to a controller responsive to a digital signal for varying the outputs of a differential amplifier.

BACKGROUND AND SUMMARY OF THE INVENTION

An example of a differential amplifier used as a multiplier circuit is described in U.S. Pat. No. 4,156,283 issued May 22, 1979 to Gilbert. Two signals are multiplied in this circuit. First, a pair of control signals are applied to a first differential amplifier for producing a pair of differential signals from an input signal. These signals are further modulated by a second pair of control signals. This second pair of control signals is generated by a second differential amplifier. There is therefore produced a pair of output signals the difference between which represent a multiplication of the two sets of control signals.

Conventional differential amplifier controllers, such as the one disclosed by Gilbert tend to be sensitive to power supply variations, are somewhat complex, and use a significant amount of power.

The present invention provides a controller for a differential multiplier which uses less power, is simpler in structure, and relatively insensitive to power supply variations. In addition, because the gain is dependent only upon currents $I_1$ and $I_2$, the gain accuracy of the circuit is much improved over standard Gilbert multiplier implementations.

A differential amplifier is responsive to first and second control signals for generating from an input signal first and second output signals, respectively. The controller of the present invention generates a digital signal representative of a desired relationship between the first and second output signals. The digital signal is converted into the first and second control signals such that the desired relationship between the first and second output signals results from applying the control signals to the differential amplifier.

In the preferred embodiment, the digital signal is converted by a digital to analog converter (DAC) for converting the digital signal into a pair of analog signals. The DAC outputs the analog signals as currents on a pair of conductors, with the sum of the currents being a constant and the relative magnitudes of the currents being determined by the digital signal. Means are provided for maintaining the voltages of the conductors carrying the analog signals at a common level for preferred operation of the DAC.

Differential amplifiers are useful in a variety of situations which require amplification or multiplication of signals. The present invention was developed for manually controlling a signal input to an oscilloscope. For each knob position a unique digital signal is generated for controlling the scope image. Appropriate knob positions also provide for inverting the signal. Thus, the viewed signal image can take a range of $\pm 1$ times the input signal. It will be appreciated however that the invention has applicability to a variety of applications.

Thus a simple controller is provided which is easy to operate, dependable and reliable. These and other features and advantages of the present invention will become apparent from a reading of the following detailed description of the preferred embodiment in conjunction with the accompanying drawings.

DETAILED DESCRIPTION OF THE PREFERRED EMBODIMENT

Figure 1:
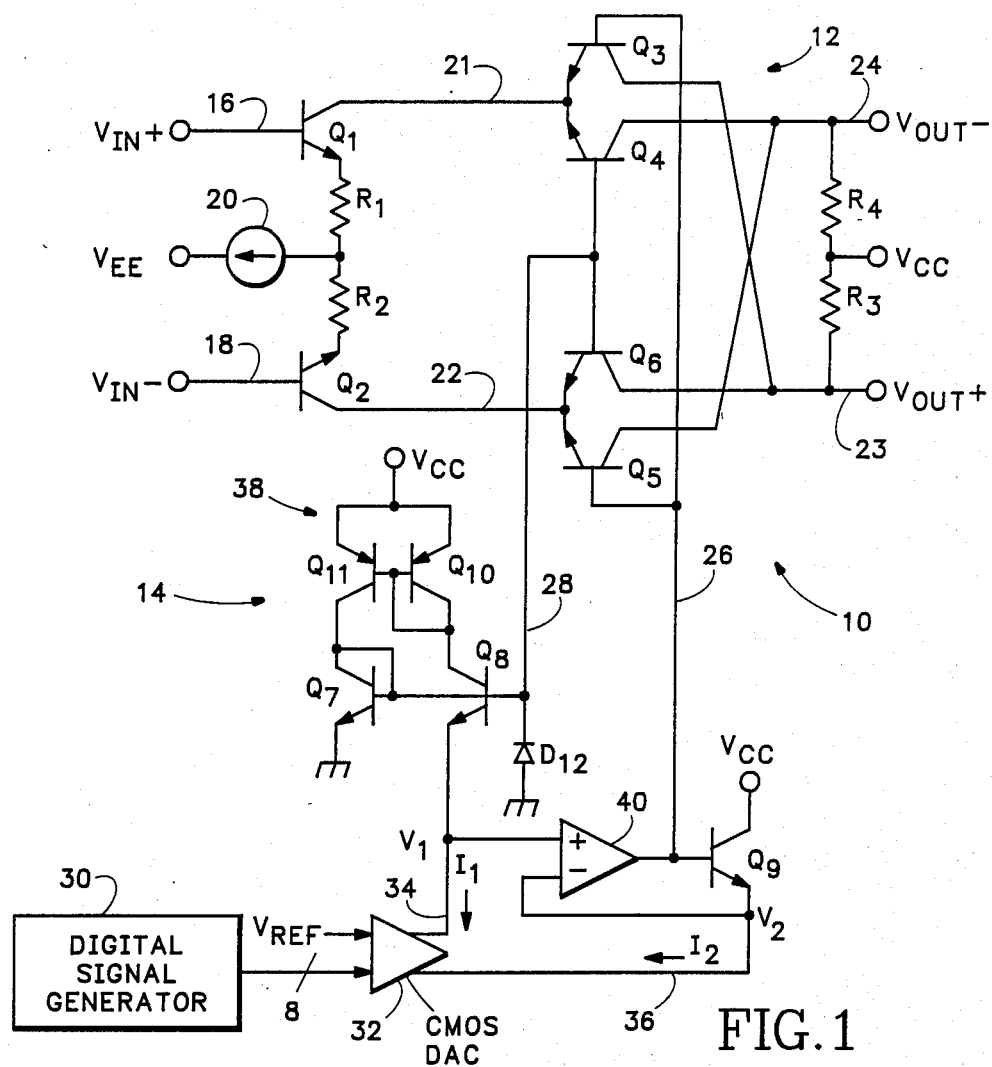
FIG. 1 is a general circuit schematic of a differential amplifier having a controller made according to the present invention.

Referring initially to FIG. 1, a differential amplifier made according to the present invention is shown generally at 10. Amplifier 10 includes a differential amplification circuit 12, also referred to as a Gilbert gain cell, and a controller 14. Circuit 12 has a pair of input terminals 16 and 18 across which a differential input voltage $V_{in}$ is applied. These voltages are fed to the bases of transistors $Q_1$ and $Q_2$, respectively. These transistors have currents the sum of which are determined by current source 20 which feeds through resistors $R_1$ and $R_2$.

The current passing through transistors $Q_1$ and $Q_2$ also passes through respective pairs of differentially connected transistor pairs $Q_3/Q_4$ and $Q_5/Q_6$, as shown, via conductors 21 and 22. The collectors of transistors $Q_3$ and $Q_6$ are connected to an output conductor 23, and the collectors of transistors $Q_4$ and $Q_5$ are connected to an output conductor 24. Conductors 23 and 24 carry respective output voltages $V_{out}-$ and $V_{out}+$ which form the differential output voltage $V_{out}$. Conductors 23 and 24 are also connected to voltage source $V_{cc}$ through resistors $R_3$ and $R_4$, respectively.

Circuit 12 forms a conventional Gilbert multiplier circuit. The maximum gain is set by the ratio of resistors $R_{1,2}$ to resistors $R_{3,4}$. The bases of transistors $Q_3$ and $Q_5$ and of transistors $Q_4$ and $Q_6$ are tied together, respectively, by conductors 26 and 28. The actual gain of circuit 12 is proportional to the differential currents on conductors 26 and 28. Controller 14 establishes the currents on these conductors.

Controller 14 includes a digital signal generator 30, such as the manually adjustable oscilloscope knob discussed previously. Generator 30 outputs one byte of digital data which is representative of a desired relationship of the output signals on conductors 23 and 24. This data is fed into a CMOS DAC 32 which then generates analog currents on conductors 34 and 36 corresponding to the digital signal input to it. Because the gain cell is controlled by the difference over the sum of currents $I_1$ and $I_2$, the value and stability of the reference voltage, $V_{ref}$, are not critical.

In order for DAC 32 to operate effectively, the voltages $V_2$ and $V_2$ on conductors 34 and 36 need to be kept at virtual ground. Voltage $V_2$ is maintained at virtual ground by the use of npn transistors $Q_7$ and $Q_8$ which have their bases connected together and to conductor 28. A current mirror 38 provides equal currents for these two transistors. The emitter of transistor $Q_7$ is grounded. Thus the base-to-emitter voltages of these transistors are equal. This forces $V_1$ to be at 0 volts.

The current mirror consists of pnp transistors $Q_{10}$ and $Q_{11}$ which are connected to a power supply having voltage $V_{cc}$. The bases of these transistors are connected and also connected to the collector of transistor $Q_{10}$. The collectors of transistors $Q_7$ and $Q_8$ are respectively connected to the collectors of transistors $Q_{10}$ and $Q_{11}$, as shown. The collector and base of transistor $Q_7$ are shorted.

This current mirror arrangement has two stable operating points, one of which is characterized by zero current flow in transistor $Q_8$. A diode $D_{12}$ assures that this is avoided, particularly at startup. The diode is connected between conductor 28 and ground with the cathode connected to conductor 28. As the voltage on conductor 28 decreases sufficiently, the diode becomes forward biased and begins to conduct. This maintains a minimum voltage on conductor 28. The current mirror and $Q_8$ then start to conduct. As they do, the voltage on conductor 28 raises and diode $D_{12}$ becomes reverse biased.

The voltage on conductor 36 is maintained at virtual ground by the combination of a transistor $Q_9$ and an operational amplifier 40. The noninverting input to the op amp is joined to conductor 34. The inverting input is joined to conductor 36. The output is connected to conductor 26 and to the base of transistor $Q_9$. The emitter of transistor $Q_9$ is connected to conductor 36. The op amp forces transistor $Q_9$ to operate so that the voltage $V_2$ on conductor 36 is maintained the same as the voltage $V_1$ on conductor 34, i.e., virtual ground.

The currents which DAC 32 outputs thus do not directly drive the controlled transistors in circuit 12. Rather, the base-emitter voltages of transistors $Q_8$ and $Q_9$, which are a function of currents $I_1$ and $I_2$, form the difference in base-emitter voltages for transistors $Q_4$ and $Q_6$ and of transistors $Q_3$ and $Q_5$, respectively. Operation of the differential amplification circuit 12 is thus controlled by operation of DAC 32.

Figure 2:
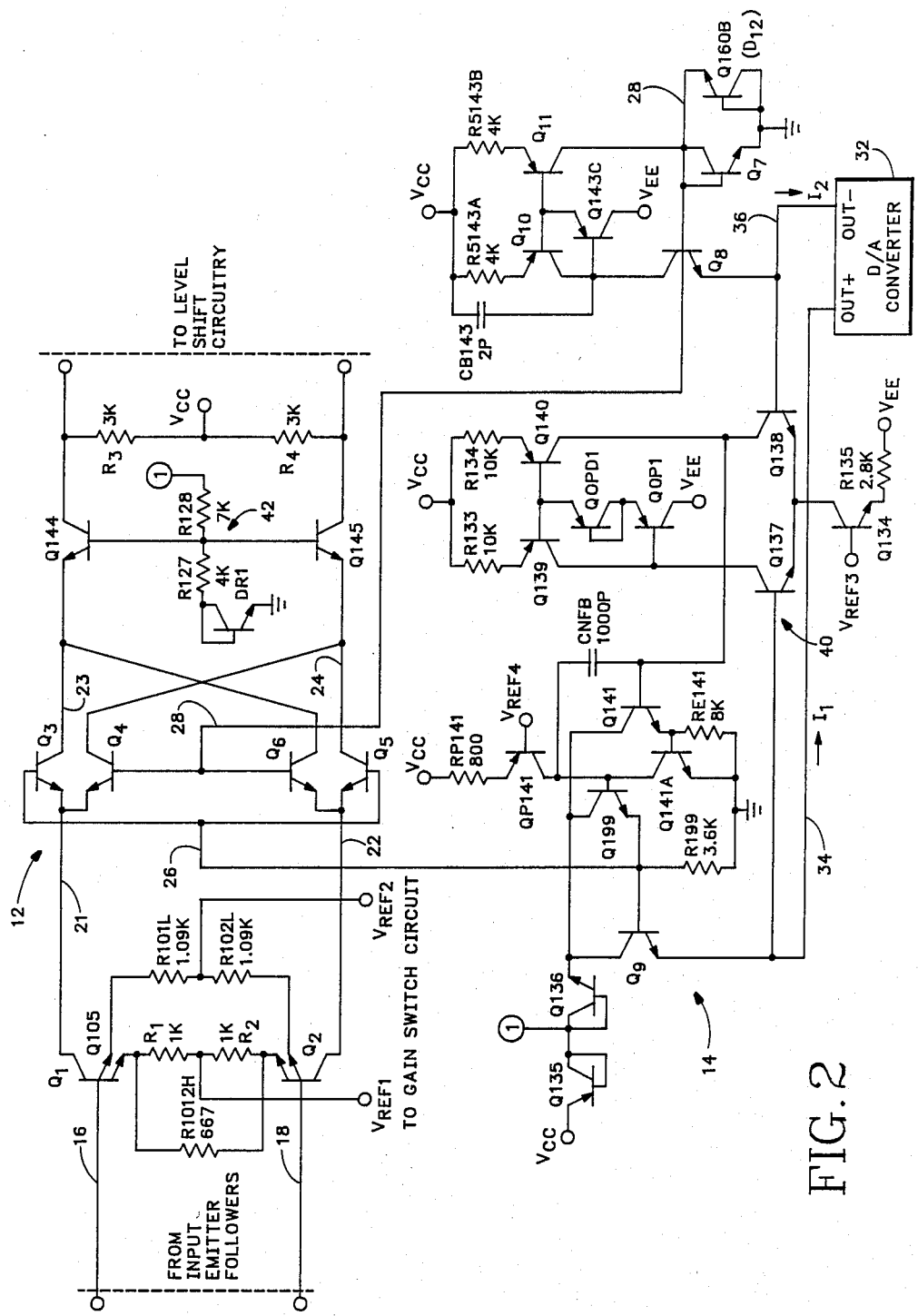
FIG. 2 is a further detailed schematic of the circuit of FIG. 1.

Referring now to FIG. 2, a partial schematic of differential amplifier 10 is shown. The same components are shown with the same reference numbers. This circuit shows the specific circuitry provided in an actual embodiment of the circuit of the invention.

Conductors 23 and 24 are shown to include inline transistors $Q_{144}$ and $Q_{145}$. The bases of these transistors are connected together and to a voltage divider circuit 42. This circuit arrangement is used for impedance matching with a subsequent low impedance circuit and to protect the output section of circuit 12 from changes in voltage at the output.

Current mirror 38 is shown with additional components for stabilizing and establishing a selected current level. Op amp 40 is shown formed of differentially connected transistors $Q_{137}$, the base of which is the inverting input, and $Q_{138}$, the base of which is the noninverting input. The output is taken at the emitter of a transistor $Q_{199}$, as shown. The input stage of circuit 12 is similar to the stage shown in FIG. 1, with the exception of an additional set of emitters and resistors for discrete gain switching in FIG. 2. The digital signal generator is omitted for simplicity.

It can be seen that the present invention provides a differential amplifier which is simple to construct, is relatively insensitive to power supply variations, and inherently uses little power. This is accomplished through the use of a generator for generating a digital signal representative of a desired output current relationship. The digital signal is converted to an analog signal and applied to the control terminals of the differential amplification circuit.

Although the invention has been described with reference to the foregoing preferred embodiment, it will be appreciated that variations in the circuits may be made, for instance to accommodate different circuit requirements and applications, without varying from the spirit and scope of the invention as described in the claims.

We claim:

1. A controller for a Gilbert multiplier circuit responsive to first and second control signals for generating first and second output signals, respectively; said controller comprising:
   means for generating a digital signal representative of a desired relationship between the first and second output signals; and
   means coupled to the Gilbert multiplier circuit for converting the digital signal into the first and second control signals such that the desired relationship between the first and second output signals results from applying the control signals to the Gilbert multiplier circuit.

2. A controller according to claim 1 wherein said converting means comprises DAC means for converting the digital signal into a pair of analog signals.

3. A controller according to claim 2 wherein said DAC means includes means for providing the analog signals as currents on a pair of conductors, with the sum of the currents being a constant and the relative magnitudes of the currents being determined by the digital signal.

4. A controller according to claim 3 wherein said converting means further comprises means for maintaining the voltages of the conductors carrying the analog signals at a common level.

5. A controller according to claim 4 wherein the common voltage level of the conductors is at virtual ground, and said maintaining means comprises first and second transistor means the bases of which are connected, a conducting terminal of said first transistor means being connected to ground, a conducting terminal of said second transistor means being connected to one of said conductors, and both of said transistor means being driven with currents of the same value.

6. A controller according to claim 5 wherein the signal on the bases of said first and second transistor means forms one of the control signals and are also coupled to ground through diode means to prevent said transistor means from taking a state of zero current conduction.

7. A controller according to claim 6 wherein said maintaining means further comprises third transistor means coupled between a power supply and the other of said conductors, and operational amplifier means having two input terminals, each coupled to a different one of said conductors, the output of said operational amplifier means being coupled to the base of said third transistor means, with the signal one the base of said third transistor means forming the other control signal.

8. A controllable Gilbert multiplier circuit comprising:
   a Gilbert multiplier circuit responsive to first and second control signals for generating from an input signal first and second output signals, respectively;
   means for generating a digital signal representative of a desired relationship between the first and second output signals; and
   means coupled to the Gilbert multiplier circuit for converting the digital signal into the first and second control signals such that the desired relationship between the first and second output signals results from applying the control signals to said Gilbert multiplier circuit.

9. A controllable Gilbert multiplier circuit according to claim 8 wherein said converting means comprises DAC means for converting the digital signal into a pair of analog signals.

10. A controllable Gilbert multiplier circuit according to claim 9 wherein said Gilbert multiplier circuit generates output signals representative of the currents on the control signals, said DAC means including means for providing the analog signals as currents on a pair of conductors, with the sum of the currents being a constant and the relative magnitudes of the currents being determined by the digital signal.

11. A controllable Gilbert multiplier circuit according to claim 10 wherein said converting means further comprises means for maintaining the voltages of said conductors carrying the analog signals at a common level.

12. A controllable Gilbert multiplier circuit according to claim 11 wherein the common voltage level of said conductors is at virtual ground, and said maintaining means comprises first and second transistor means the bases of which are connected, a conducting terminal of said first transistor means being connect to ground, a conducting terminal of said second transistor means being connected to one of said conductors, and both of said transistor means being driven with currents of the same value.

13. A controllable Gilbert multiplier circuit according to claim 12 wherein the signal on the bases of said first and second transistor means forms one of the control signals and are also coupled to ground through diode means to prevent said transistor means from taking a state of zero current conduction.

14. A controllable Gilbert multiplier circuit according to claim 13 wherein said maintaining means further comprises a third transistor means coupled between a power supply and the other of said conductors, and operational amplifier means having two input terminals, each coupled to a different one of said conductors, the output of said operational amplifier means being coupled to the base of said third transistor means, with the signal on the base of said third transistor means forming the other control signal.

* * * * *